US011910656B2

(12) United States Patent
Lee et al.

(10) Patent No.: US 11,910,656 B2
(45) Date of Patent: *Feb. 20, 2024

(54) DISPLAY DEVICE INCLUDING A PLURALITY OF LAYERS EACH INCLUDING A LIGHT EMITTING LAYER

(71) Applicant: SAMSUNG DISPLAY CO., LTD., Yongin-si (KR)

(72) Inventors: Sang Shin Lee, Yongin-si (KR); Joon Young Park, Yongin-si (KR); Min Goo Kang, Yongin-si (KR); Jung Woo Ko, Seoul (KR); Jong Sung Park, Seoul (KR); Hong Kyun Ahn, Hwaseong-si (KR); Sang Min Yi, Suwon-si (KR); Sang Woo Jo, Hwaseong-si (KR); Young Eun Ryu, Asan-si (KR); Yoon Seo Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/980,897

(22) Filed: Nov. 4, 2022

(65) Prior Publication Data

US 2023/0057473 A1 Feb. 23, 2023

Related U.S. Application Data

(63) Continuation of application No. 17/135,926, filed on Dec. 28, 2020, now Pat. No. 11,515,374, which is a (Continued)

(30) Foreign Application Priority Data

May 31, 2018 (KR) .................. 10-2018-0062627

(51) Int. Cl.
H10K 50/11 (2023.01)
H10K 59/122 (2023.01)
H10K 50/81 (2023.01)

(52) U.S. Cl.
CPC .......... H10K 59/122 (2023.02); H10K 50/11 (2023.02); H10K 50/81 (2023.02)

(58) Field of Classification Search
CPC ....... H10K 50/11; H10K 50/81; H10K 59/122
(Continued)

(56) References Cited

U.S. PATENT DOCUMENTS 10,879,324 B2 * 12/2020 Lee ................. H10K 50/11
11,515,374 B2 * 11/2022 Lee ................. H10K 59/12
2003/0183830 A1 10/2003 Yamazaki et al.
2006/0243989 A1 11/2006 Yamazaki et al.
2012/0086332 A1 4/2012 Matsui et al.
(Continued)

FOREIGN PATENT DOCUMENTS

JP 2001-290441 10/2001
JP 2009-246402 10/2009
(Continued)

OTHER PUBLICATIONS

Korean Notice of Allowance dated Jul. 7, 2023, issued in corresponding Korean Patent Application No. 10-2018-0062627 (5 pages).

Primary Examiner — Hoai V Pham
(74) Attorney, Agent, or Firm — Lewis Roca Rothgerber Christie LLP

(57) ABSTRACT

A display device includes: a base substrate; a first pixel electrode, a second pixel electrode, and a third pixel electrode arranged on the base substrate to be spaced apart from each other; a pixel defining film on the first pixel electrode, the second pixel electrode, and the third pixel electrode and including a first opening exposing the first pixel electrode, a second opening exposing the second pixel electrode and spaced apart from the first opening, and a third opening exposing the third pixel electrode and spaced apart from the (Continued)

first opening and the second opening; a first organic layer on the first pixel electrode exposed by the first opening; a second organic layer on the second pixel electrode exposed by the second opening; and a third organic layer on the third pixel electrode exposed by the third opening.

24 Claims, 10 Drawing Sheets

Related U.S. Application Data continuation of application No. 16/358,557, filed on Mar. 19, 2019, now Pat. No. 10,879,324.

(58) Field of Classification Search
USPC ..................................................... 257/59, 72
See application file for complete search history.

(56) References Cited

U.S. PATENT DOCUMENTS

| | | |
|---|---|---|
| 2014/0124771 A1 | 5/2014 | Yamazaki et al. |
| 2015/0171379 A1 | 6/2015 | Min |
| 2016/0118445 A1 | 4/2016 | Yamazaki et al. |
| 2016/0133676 A1 | 5/2016 | Kim |

FOREIGN PATENT DOCUMENTS

| | | |
|---|---|---|
| JP | 2014-026983 | 2/2014 |
| JP | 2015-118923 | 6/2015 |
| KR | 10-2012-0025533 | 3/2012 |
| KR | 10-2014-0034500 A | 3/2014 |
| KR | 10-2014-0119253 A | 10/2014 |
| KR | 10-2018-0026601 | 3/2018 |
| KR | 10-2018-0028387 | 3/2018 |
| KR | 10-1845332 B1 | 5/2018 |

* cited by examiner

DISPLAY DEVICE INCLUDING A PLURALITY OF LAYERS EACH INCLUDING A LIGHT EMITTING LAYER

CROSS-REFERENCE TO RELATED APPLICATIONS

This application is a continuation of U.S. patent application Ser. No. 17/135,926, filed on Dec. 28, 2020, which is a continuation of U.S. patent application Ser. No. 16/358,557, filed on Mar. 19, 2019, now U.S. Pat. No. 10,879,324, which claims priority to and the benefit of Korean Patent Application No. 10-2018-0062627, filed on May 31, 2018, the entire contents of all of which are incorporated herein by reference.

BACKGROUND

1. Field

Aspects of embodiments of the present invention relate to a display device.

2. Description of the Related Art

Since an organic light emitting display device has self-emission characteristics and does not require a separate light source, unlike a liquid crystal display device, the thickness and weight thereof can be reduced. Further, the organic light emitting display device exhibits high-quality characteristics such as low power consumption, high luminance, and a high reaction rate.

Generally, the organic light emitting display device includes an anode electrode, a pixel defining layer including an opening for defining the area and shape of a pixel by exposing the anode electrode, an organic light emitting layer disposed on the anode electrode corresponding to the opening, and a cathode electrode disposed on the organic light emitting layer.

Here, the "pixel" refers to a minimum unit for displaying an image, and is a portion where an organic light emitting layer emits light.

The organic light emitting layer constituting the pixel of the organic light emitting display device is formed by deposition using a fine metal mask (FMM). When the gap between adjacent pixels is formed to be short in order to secure the aperture ratio of a pixel, there is a problem that the deposition reliability of the organic light emitting layer is deteriorated, and there is a problem that the aperture ratio of a pixel is lowered when the gap between pixels is formed to be long in order to improve deposition reliability.

SUMMARY

According to an aspect of embodiments of the present invention, a display device has improved reliability.

However, aspects of the present invention are not restricted to those set forth herein. The above and other aspects of the present invention will become more apparent to one of ordinary skill in the art to which the present invention pertains by referencing the detailed description of the present invention provided below.

According to one or more embodiments, a display device includes: a base substrate; a first pixel electrode, a second pixel electrode, and a third pixel electrode arranged on the base substrate to be spaced apart from each other; a pixel defining film on the first pixel electrode, the second pixel electrode, and the third pixel electrode and including a first opening exposing the first pixel electrode, a second opening exposing the second pixel electrode and spaced apart from the first opening, and a third opening exposing the third pixel electrode and spaced apart from the first opening and the second opening; a first organic layer on the first pixel electrode exposed by the first opening and including a first light emitting layer; a second organic layer on the second pixel electrode exposed by the second opening and including a second light emitting layer; and a third organic layer on the third pixel electrode exposed by the third opening and including a third light emitting layer, wherein a first thickness of a portion of the first organic layer overlapping the first pixel electrode is thicker than a second thickness of a portion of the second organic layer overlapping the second pixel electrode, the second thickness of the portion of the second organic layer overlapping the second pixel electrode is thicker than a third thickness of a portion of the third organic layer overlapping the third pixel electrode, and, in a plan view, a shortest gap between the third opening and the second opening is shorter than a shortest gap between the third opening and the first opening.

According to one or more embodiments, a display device includes: a base substrate; a first pixel electrode, a second pixel electrode, and a third pixel electrode arranged on the base substrate to be spaced apart from each other; a pixel defining film on the first pixel electrode, the second pixel electrode, and the third pixel electrode and including a first opening exposing the first pixel electrode, a second opening exposing the second pixel electrode and spaced apart from the first opening, and a third opening exposing the third pixel electrode and spaced apart from the first opening and the second opening; a first organic layer on the first pixel electrode exposed by the first opening and including a first light emitting layer; a second organic layer on the second pixel electrode exposed by the second opening and including a second light emitting layer; and a third organic layer on the third pixel electrode exposed by the third opening and including a third light emitting layer, wherein each of the first organic layer, the second organic layer, and the third organic layer has an island shape, a first thickness of a portion of the first organic layer overlapping the first pixel electrode is thicker than a second thickness of a portion of the second organic layer overlapping the second pixel electrode, the second thickness of the portion of the second organic layer overlapping the second pixel electrode is thicker than a third thickness of a portion of the third organic layer overlapping the third pixel electrode, and, in a plan view, a shortest gap between the third organic layer and the second opening is shorter than a shortest gap between the first organic layer and the second opening.

BRIEF DESCRIPTION OF THE DRAWINGS

The above and other aspects and features of the present invention will become more apparent by describing in further detail some exemplary embodiments thereof with reference to the attached drawings, in which.

DETAILED DESCRIPTION

Figure 1:
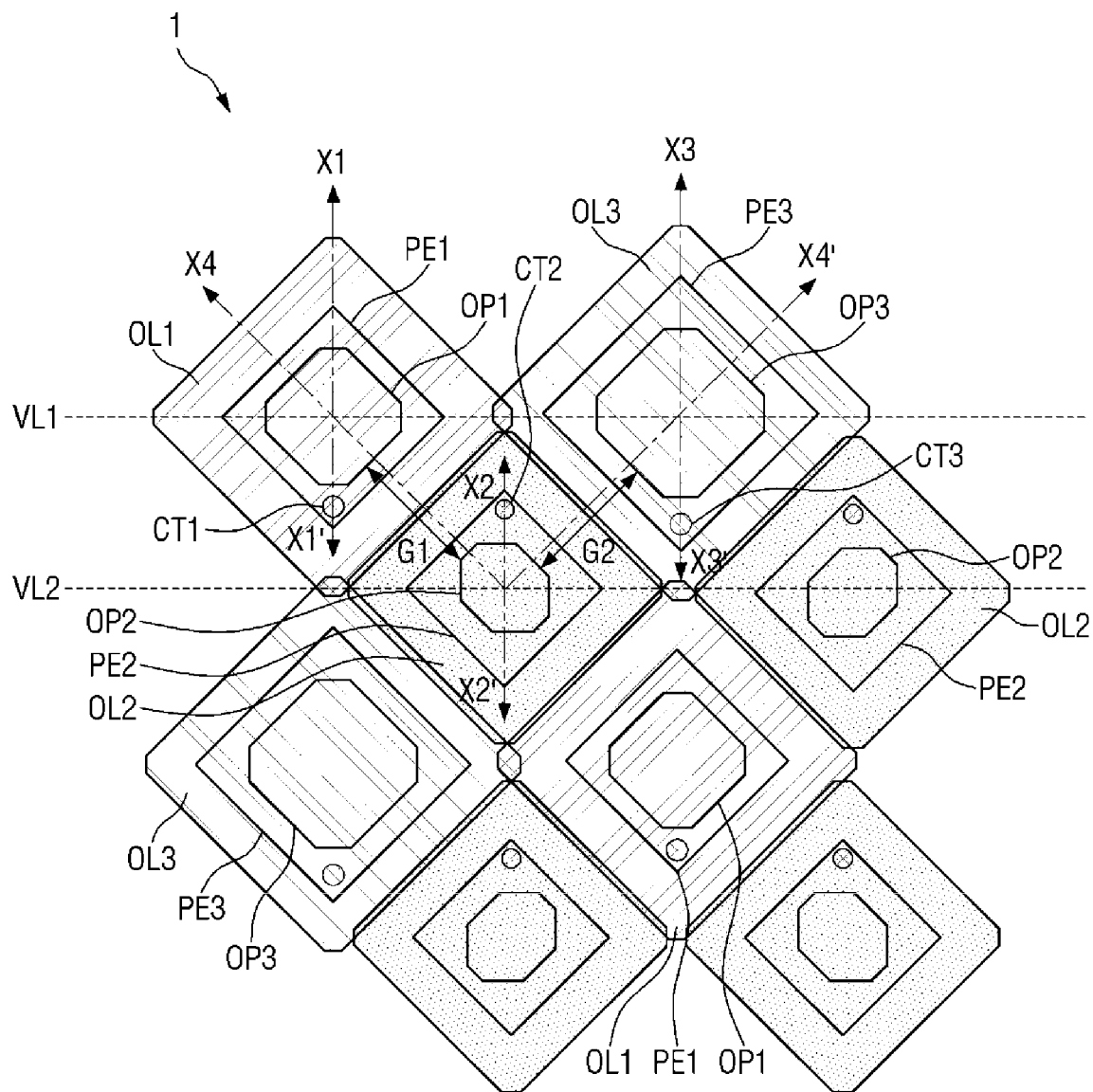
FIG. 1 is a plan view showing a portion of a display device according to an embodiment.
Figure 1:
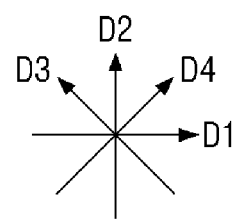

Features of the inventive concept and methods of accomplishing the same may be understood more readily by reference to the following detailed description of some embodiments and the accompanying drawings. The inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the inventive concept will be defined by the appended claims. Like reference numerals refer to like elements throughout the specification.

The terminology used herein is for the purpose of describing particular embodiments and is not intended to be limiting of the inventive concept. As used herein, the singular forms "a," "an," and "the" are intended to include the plural forms as well, unless the context clearly indicates otherwise. It is to be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It is to be understood that when an element or layer is referred to as being "on," "connected to," or "coupled to" another element or layer, it may be directly on, connected, or coupled to the other element or layer, or one or more intervening elements or layers may be present. In contrast, when an element is referred to as being "directly on," "directly connected to," or "directly coupled to" another element or layer, there are no intervening elements or layers present. As used herein, the term "and/or" includes any and all combinations of one or more of the associated listed items.

It is to be understood that, although the terms "first," "second," etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a "first" element, component, region, layer, or section discussed below could be termed a "second" element, component, region, layer, or section without departing from the teachings of the inventive concept.

Throughout the specification, same reference numerals are used for same or similar parts.

Herein, embodiments of the present invention will be described with reference to the attached drawings.

Figure 2:
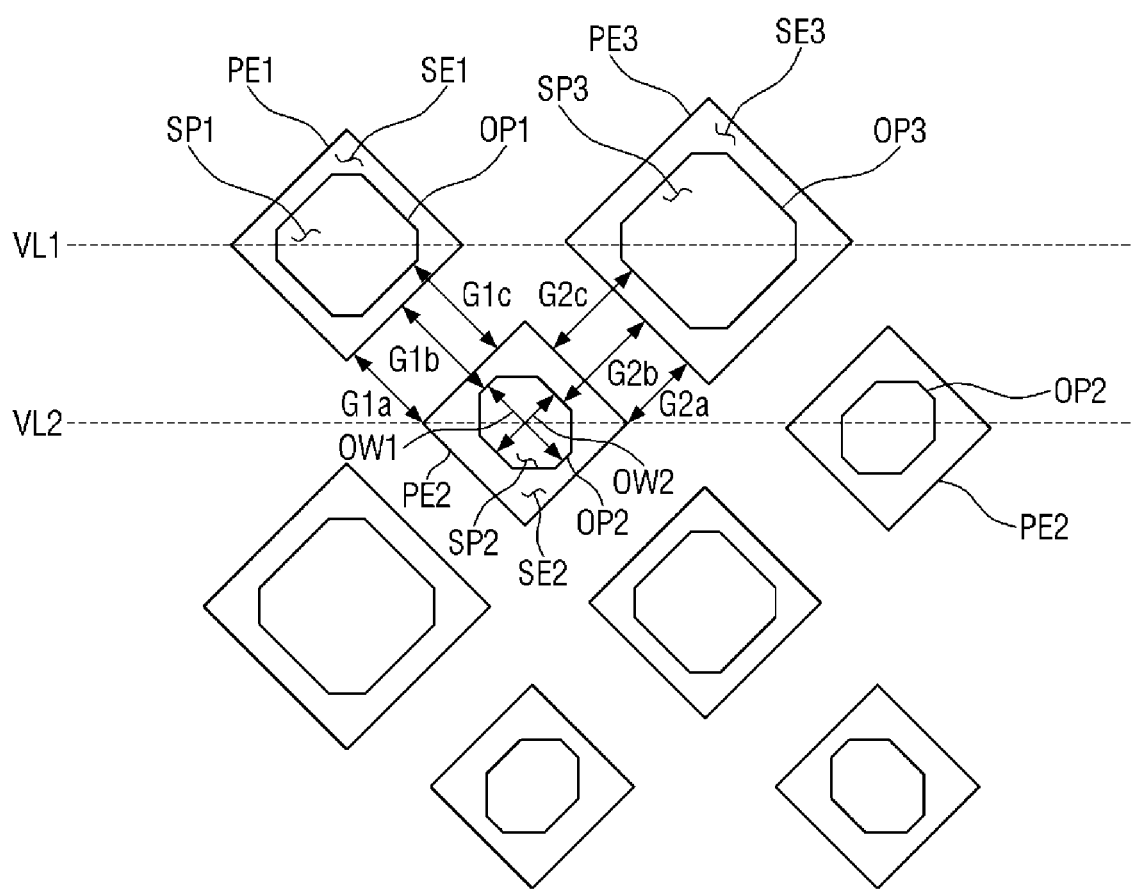
FIG. 2 is a plan view showing a relationship between openings and pixel electrodes in the display device of FIG. 1.
Figure 2:
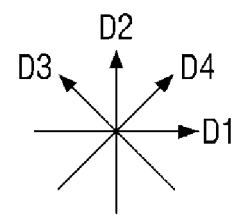
Figure 3:
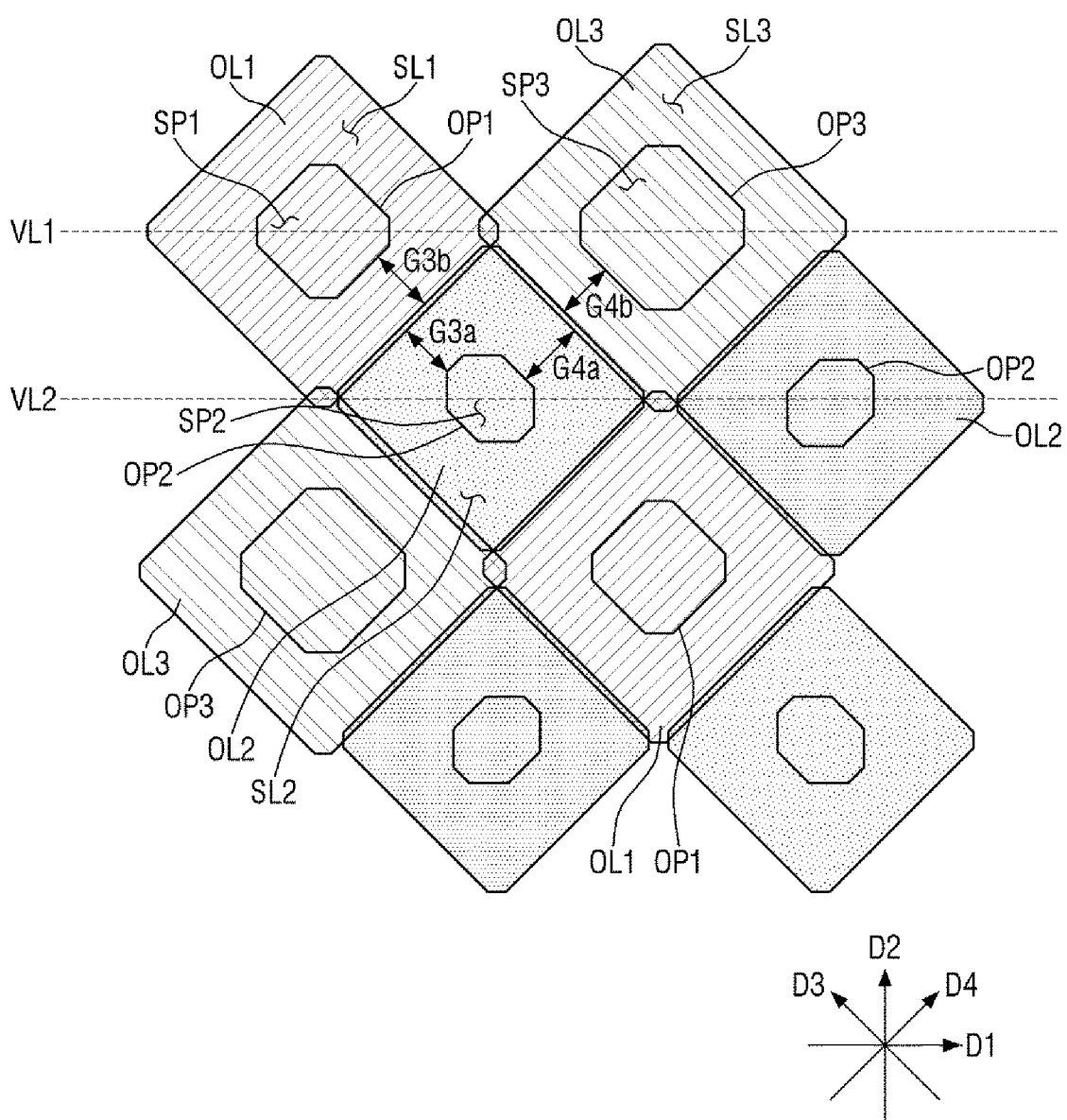
FIG. 3 is a plan view showing a relationship between openings and organic layers in the display device of FIG. 1.
Figure 4:
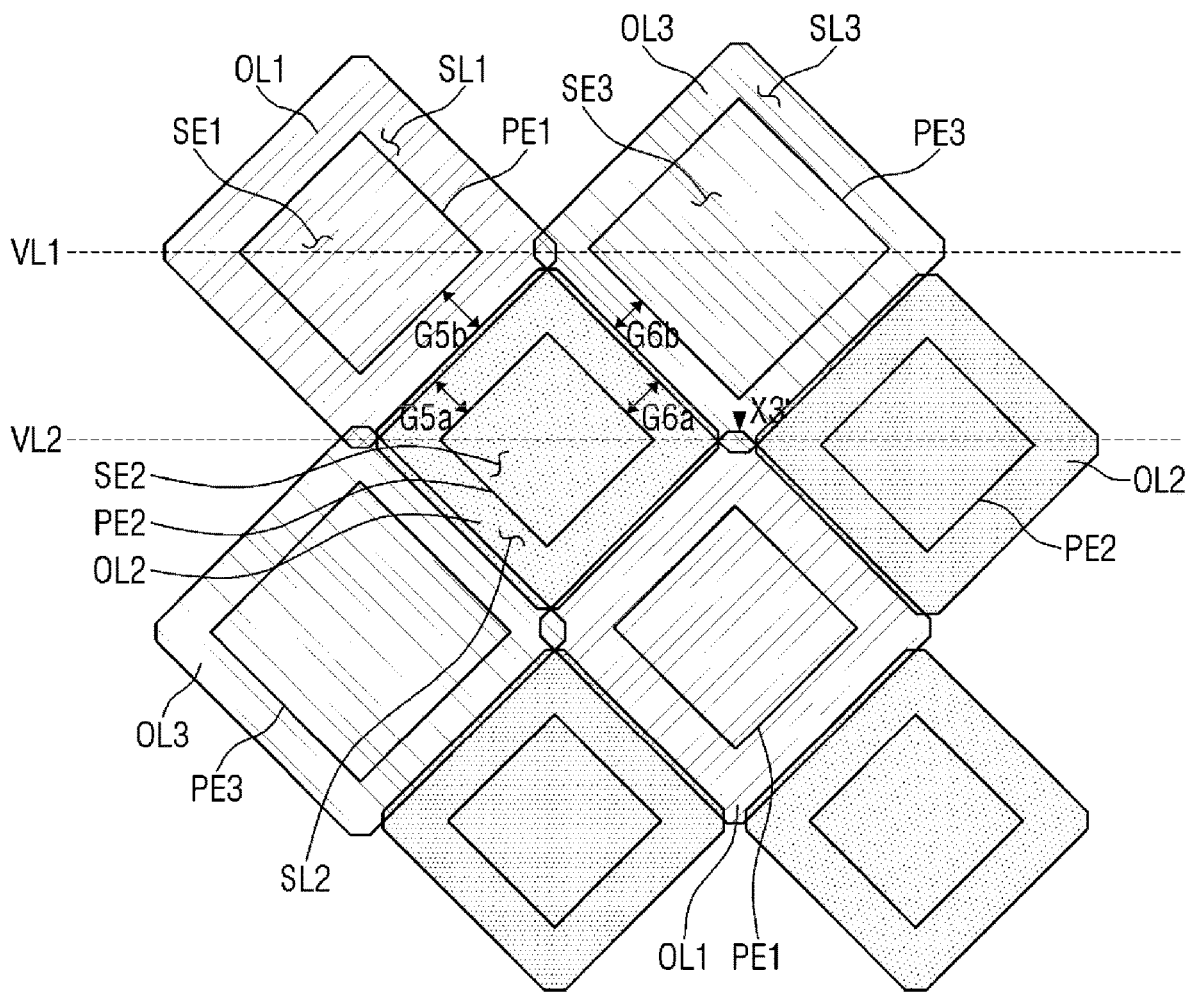
FIG. 4 is a plan view showing a relationship between pixel electrodes and organic layers in the display device of FIG. 1.
Figure 4:
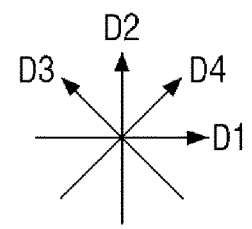
Figure 5:
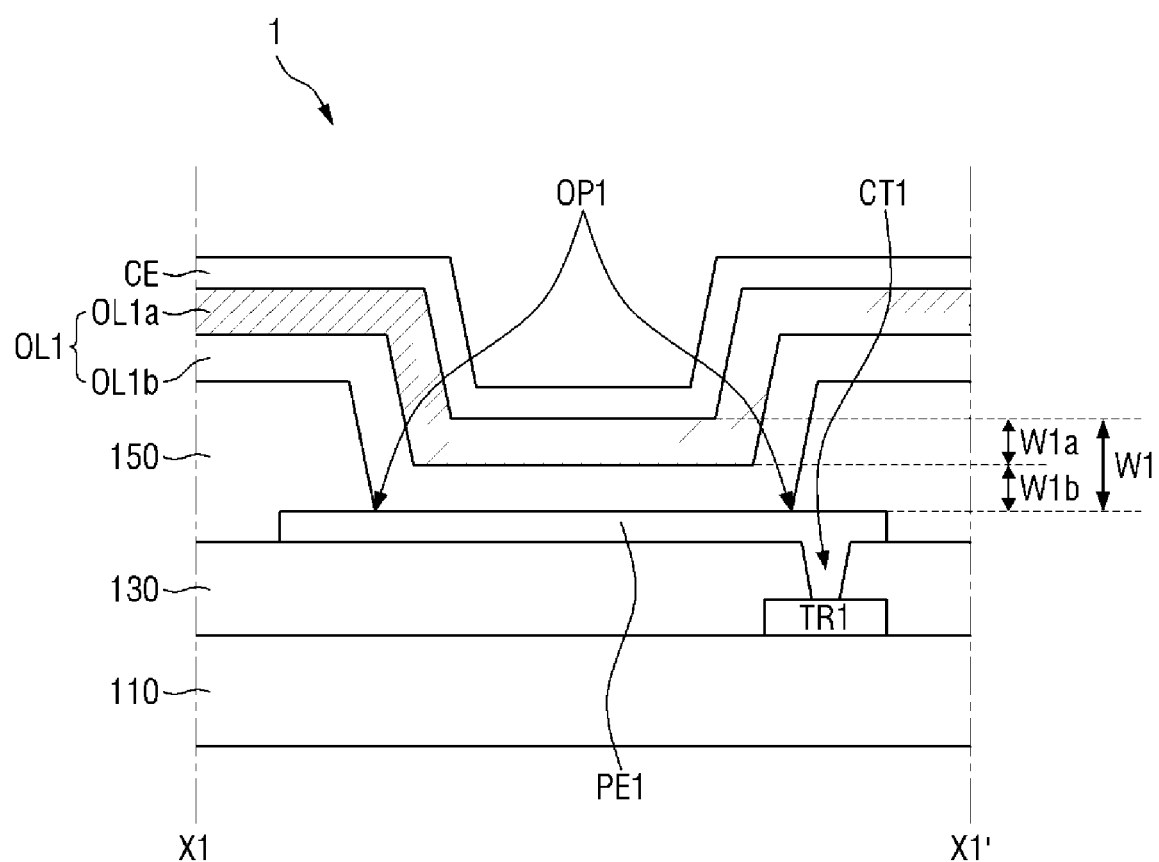
FIG. 5 is a cross-sectional view taken along the line X1-X1' in FIG. 1.
Figure 6:
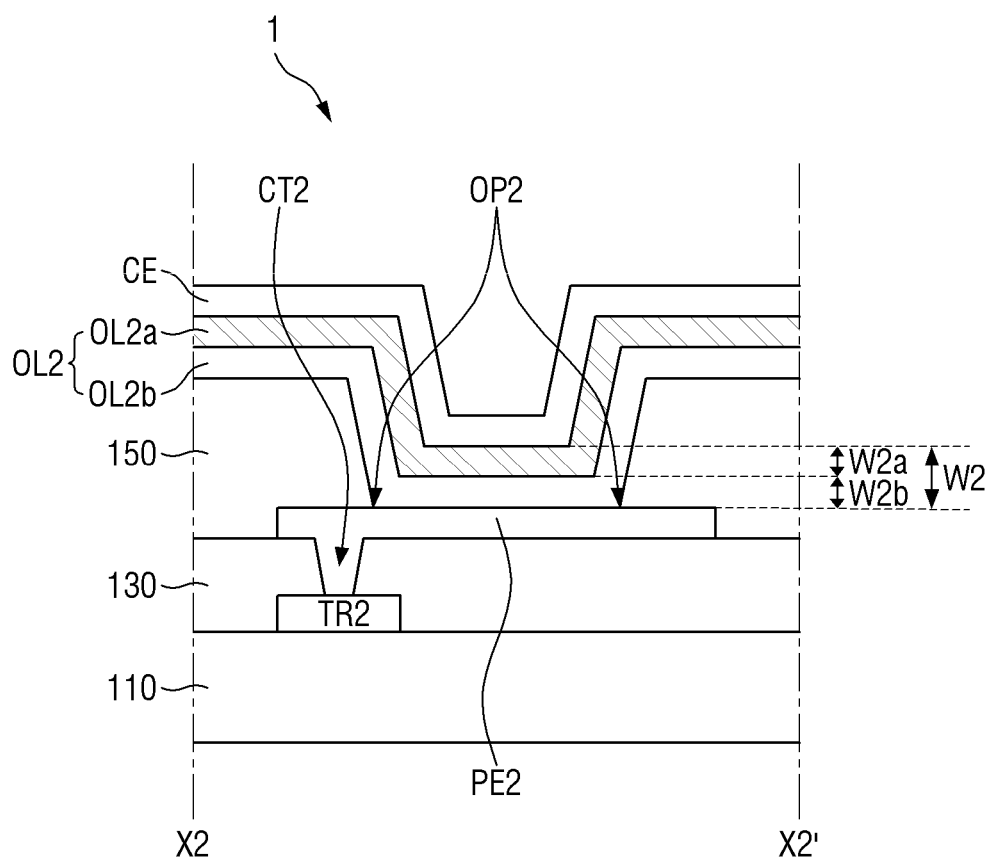
FIG. 6 is a cross-sectional view taken along the line X2-X2' in FIG. 1.
Figure 7:
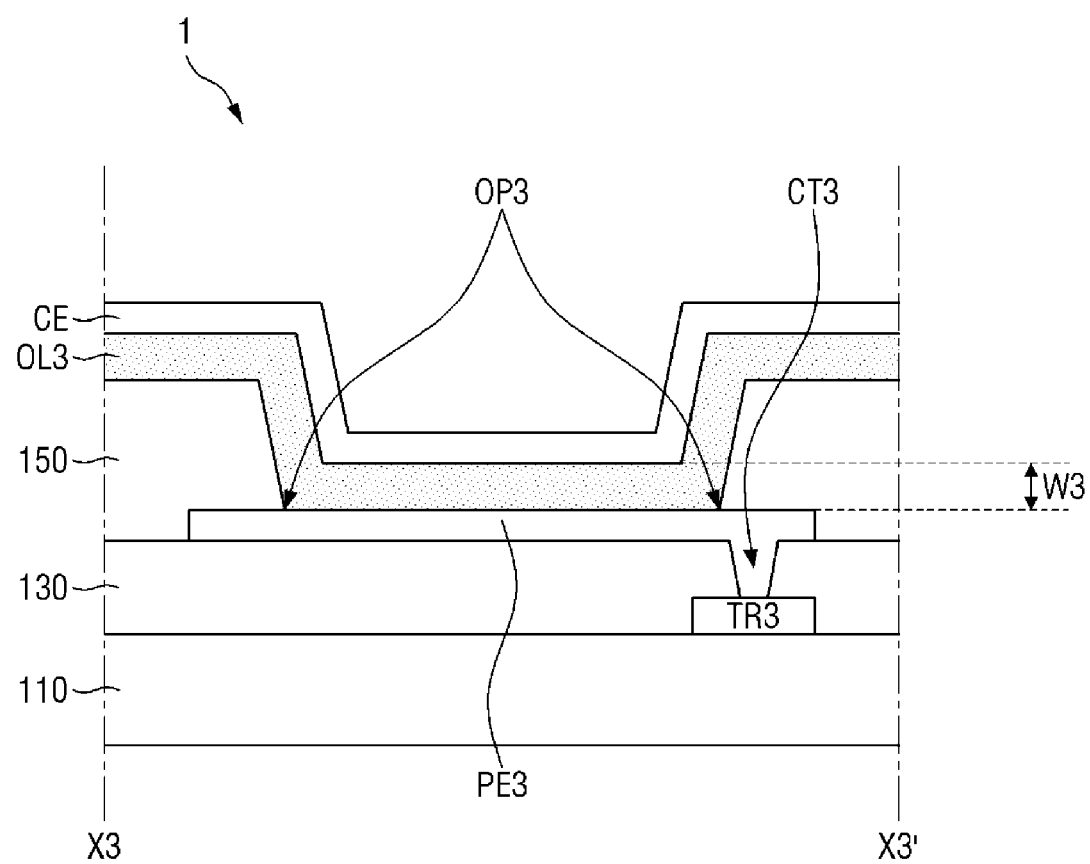
FIG. 7 is a cross-sectional view taken along the line X3-X3' in FIG. 1.
Figure 8:
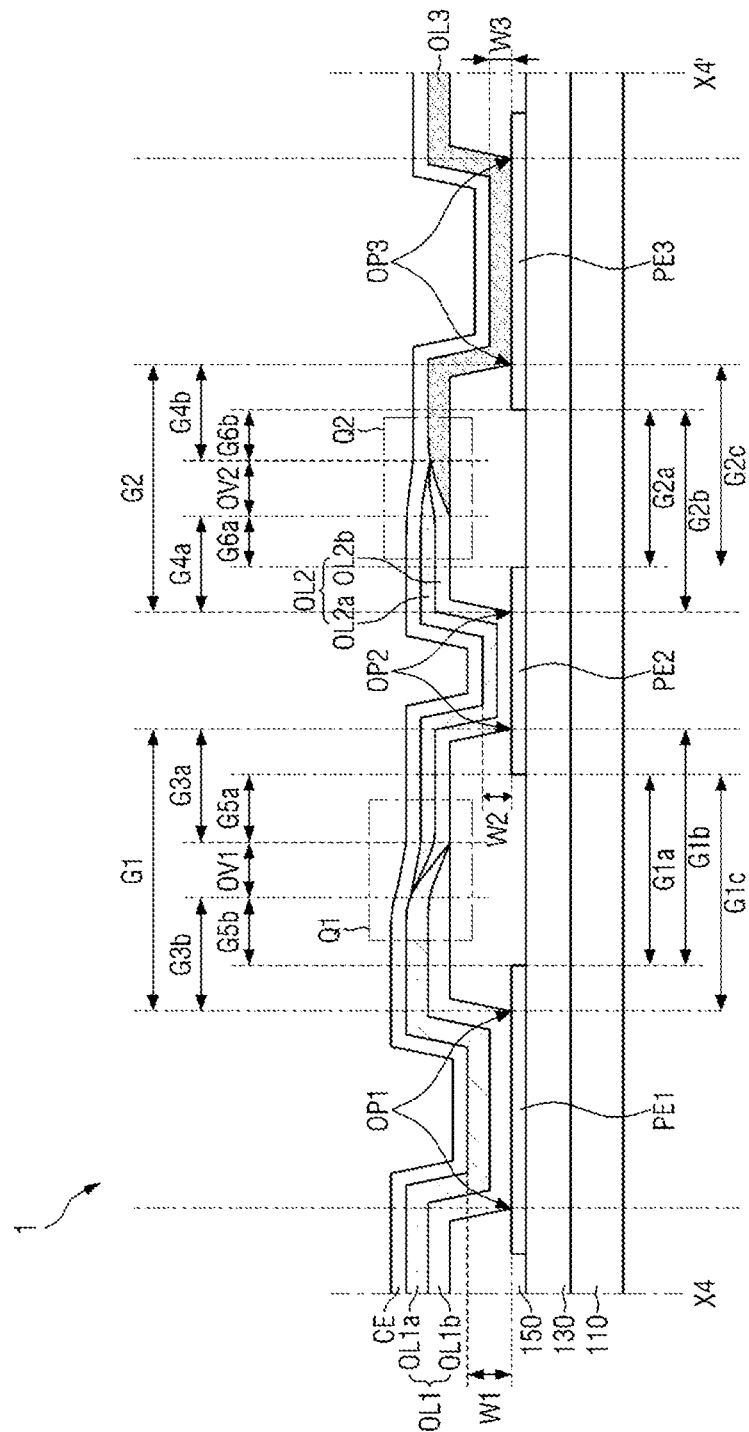
FIG. 8 is a cross-sectional view taken along the line X4-X4' in FIG. 1.
Figure 9:
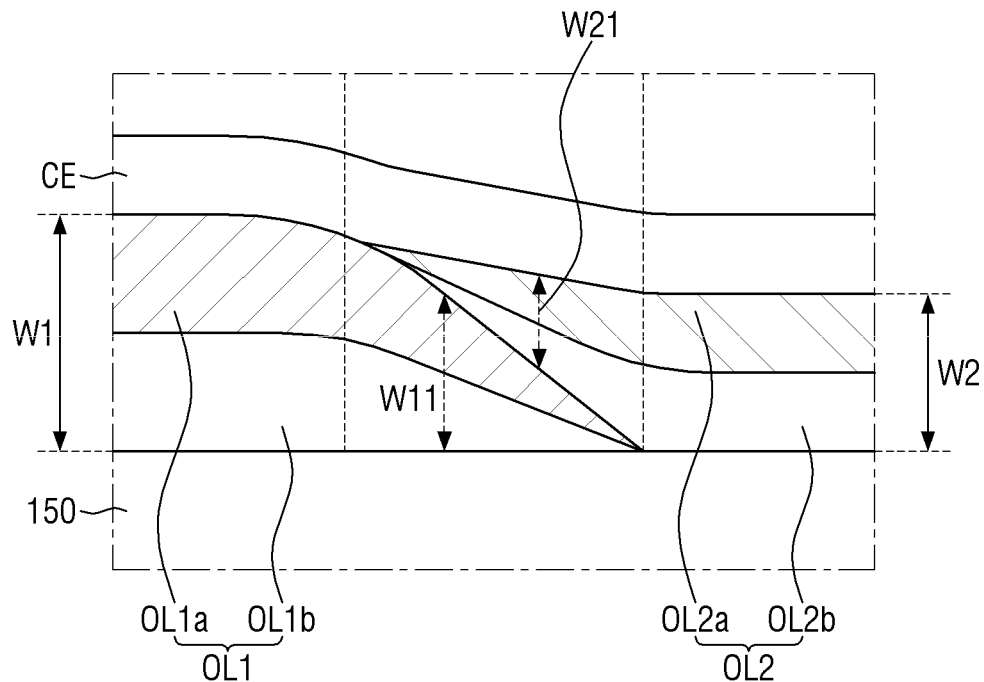
FIG. 9 is an enlarged plan view of the region "Q1" in FIG. 8.
Figure 10:
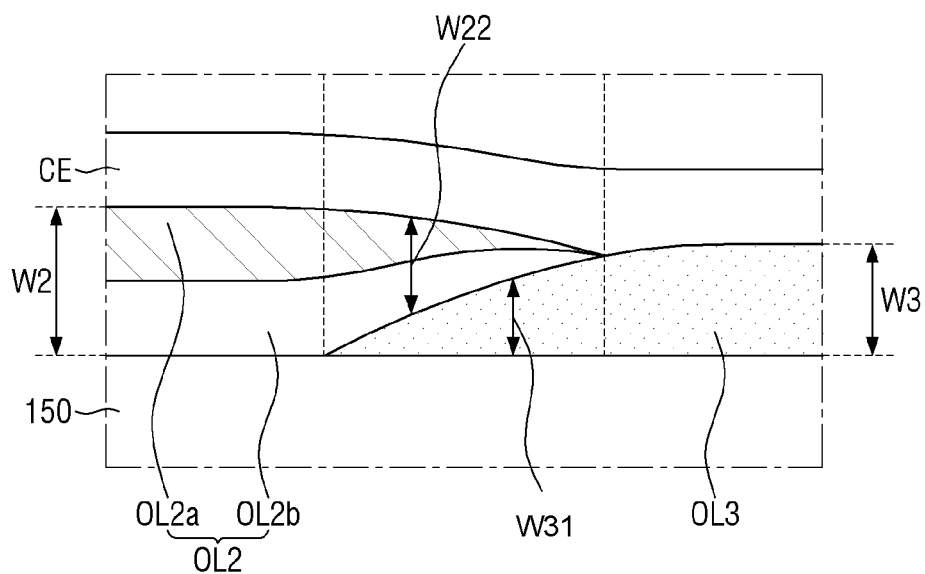
FIG. 10 is an enlarged plan view of the region "Q2" in FIG. 8.

FIG. 1 is a plan view showing a portion of a display device according to an embodiment; FIG. 2 is a plan view showing a relationship between openings and pixel electrodes in the display device of FIG. 1; FIG. 3 is a plan view showing a relationship between openings and organic layers in the display device of FIG. 1; FIG. 4 is a plan view showing a relationship between pixel electrodes and organic layers in the display device of FIG. 1; FIG. 5 is a cross-sectional view taken along the line X1-X1' in FIG. 1; FIG. 6 is a cross-sectional view taken along the line X2-X2' in FIG. 1; FIG. 7 is a cross-sectional view taken along the line X3-X3' in FIG. 1; FIG. 8 is a cross-sectional view taken along the line X4-X4' in FIG. 1; FIG. 9 is an enlarged plan view of the region "Q1" in FIG. 8; and FIG. 10 is an enlarged plan view of the region "Q2" in FIG. 8.

Referring to FIGS. 1 to 10, a display device 1 may include a base substrate 110, a first pixel electrode PE1, a second pixel electrode PE2, a third pixel electrode PE3, a pixel defining film 150, a first organic layer OL1, a second organic layer OL2, a third organic layer OL3, and a common electrode CE, and may further include a first switching device TR1, a second switching device TR2, a third switching device TR3, and an interlayer insulating film 130.

The base substrate 110 may be made of an insulating material, such as glass, quartz, or a polymer resin. Examples of the polymer resin may include polyether sulfone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), and combinations thereof. In an embodiment, the base substrate 110 may include a metal material.

The base substrate 110 may be a rigid substrate, or may be a flexible substrate that is bendable, foldable, or rollable. Examples of a material constituting the flexible substrate may include polyimide (PI), but are not limited thereto.

The first switching element TR1, the second switching element TR2, and the third switching element TR3 may be disposed on the base substrate 110. In addition, although not shown in the drawing, a wiring including at least one scan line, at least one data line, at least one driving power supply line, at least one common power supply line, and at least one initiation power supply line, and a pixel circuit such as a capacitor may be disposed on the base substrate 110. In some embodiments, the first switching element TR1, the second switching element TR2, and the third switching element TR3 may be thin film transistors, respectively.

The interlayer insulating film 130 may be disposed on the first switching element TR1, the second switching element TR2, and the third switching element TR3. In some embodiments, the interlayer insulating film 130 may be made of an organic insulating material, but the present invention is not limited thereto.

A first contact hole CT1 may be formed in the interlayer insulating film 130 to expose a part of the first switching element TR1, for example, a drain electrode of the first switching element TR1. Further, a second contact hole CT2 may be formed in the interlayer insulating film 130 to expose a drain electrode of the second switching element TR2, and a third contact hole CT3 may be formed in the interlayer insulating film 130 to expose a drain electrode of the third switching element TR3.

The first pixel electrode PE1, the second pixel electrode PE2, and the third pixel electrode PE3, which are spaced apart from each other, may be disposed on the interlayer insulating film 130.

In some embodiments, each of the first pixel electrode PE1, the second pixel electrode PE2, and the third pixel electrode PE3 may be an anode electrode. In some embodiments, each of the first pixel electrode PE1, the second pixel electrode PE2, and the third pixel electrode PE3 may have a single-layer structure of ITO, Ag, or a metal mixture (for example, a mixture of Ag and Mg), a two-layer structure of ITO/Mg or ITO/MgF, or a three-layer structure of ITO/Ag/ITO, but the present invention is not limited thereto.

The first pixel electrode PE1 may be connected to the first switching element TR1 through the first contact hole CT1, the second pixel electrode PE2 may be connected to the second switching element TR2 through the second contact hole CT2, and the third pixel electrode PE3 may be connected to the third switching element TR3 through the third contact hole CT3.

When seen in a plan view, each of the first pixel electrode PE1, the second pixel electrode PE2, and the third pixel electrode PE3 may have an island shape. In some embodiments, each of the first pixel electrode PE1, the second pixel electrode PE2, and the third pixel electrode PE3 may have a polygonal shape, for example, a rectangular shape.

In some embodiments, centers of the first pixel electrode PE1 and the third pixel electrode PE3 may be disposed on a first imaginary line VL1 extending along a first direction D1, and the first pixel electrodes PE1 and the third pixel electrodes PE3 may be alternately arranged along the first imaginary line VL1. Further, in some embodiments, centers of the second pixel electrodes PE2 may be spaced apart along a second direction D2 substantially perpendicular to the first direction D1 and may be disposed on a second imaginary line VL2 parallel to the first imaginary line VL1, and the first pixel electrodes PE1 and the third pixel electrodes PE3 may not be disposed on the second imaginary line VL2.

In some embodiments, the center of the first pixel electrode PE1, the center of the second pixel electrode PE2, and the center of the third pixel electrode PE3 may be disposed on each vertex of an imaginary triangle.

When the "direction" intersecting the first direction D1 and the second direction D2 on the plane is referred to as a third direction D3, and the "direction" intersecting all the first direction D1, the second direction D2, and the third direction D3 on the plane is referred to as a fourth direction D4, the first pixel electrode PE1 may be disposed adjacent to the second pixel electrode PE2 along the third direction D3, and the third pixel electrode PE3 may be disposed adjacent to the second pixel electrode PE2 along the fourth direction D4.

The areas of the first pixel electrode PE1, the second pixel electrode PE2, and the third pixel electrode PE3 may be different from each other. Illustratively, an area SE3 of the third pixel electrode PE3 may be larger than an area SE1 of the first pixel electrode PE1 and an area SE2 of the second pixel electrode PE2, and the area SE1 of the first pixel electrode PE1 may be larger than the area SE2 of the second pixel electrode PE2.

In some embodiments, a shortest gap G1a between the first pixel electrode PE1 and the second pixel electrode PE2 may be longer than a shortest gap G2a between the third pixel electrode PE3 and the second pixel electrode PE2. This is because a first shortest gap G1 between the first opening OP1 and the second opening OP2 to be described later is longer than a second shortest gap G2 between the third opening OP3 and the second opening OP2 to be described later.

The pixel defining film 150 may be disposed on the interlayer insulating layer 130, the first pixel electrode PE1, the second pixel electrode PE2, and the third pixel electrode PE3. The pixel defining film 150 may cover edges of the first pixel electrode PE1, the second pixel electrode PE2, and the third pixel electrode PE3.

The pixel defining film 150 includes a first opening OP1 partially exposing the first pixel electrode PE1, a second opening OP2 partially exposing the second pixel electrode PE2, and a third opening OP3 partially exposing the third pixel electrode PE3.

Each of the first opening OP1, the second opening OP2, and the third opening OP3 defines the area and planar shape of a pixel that is a minimum unit for displaying an image.

The first opening OP1 overlaps the first pixel electrode PE1, the second opening OP2 overlaps the second pixel electrode PE2, and the third opening OP3 overlaps the third pixel electrode PE3.

In some embodiments, each of the first opening OP1, the second opening OP2, and the third opening OP3 may have an octagonal planar shape. However, the present invention is not limited thereto, and each of the first opening OP1, the second opening OP2, and the third opening OP3 may have a planar shape of a polygon such as a triangle, a rectangle, a pentagon, or a hexagon, or a planar shape of a closed loop. The first opening OP1, the second opening OP2, and the third opening OP3 are spaced apart from each other.

The areas of the first opening OP1, the second opening OP2, and the third opening OP3 on the plane may be different from each other. Illustratively, an area SP3 of the third opening OP3 may be larger than an area SP2 of the second opening OP2 and an area SP1 of the first opening OP1, and the area SP1 of the first opening OP1 may be larger than the area SP2 of the second opening OP2. In some embodiments, in the case of pixel electrodes, the areas of the second pixel electrode PE2, the first pixel electrode PE1, and the third pixel electrode PE3 may become larger in this order, and even in the case of openings, the areas of the second opening OP2, the first opening OP1, and the third opening OP3 may become larger in this order.

In some embodiments, centers of the first openings OP1 and the third openings OP3 may be disposed on the first imaginary line VL1 extending along the first direction D1, and the first openings OP1 and the third openings OP3 may be alternately arranged along the first imaginary line VL1. Further, in some embodiments, centers of the second openings OP2 may be disposed on the second imaginary line VL2 parallel to the first imaginary line VL1, and the first openings OP1 and the third opening OP3 may not be disposed on the second imaginary line VL2.

In some embodiments, the center of the first opening OP1, the center of the second opening OP2, and the center of the third opening OP3 may be disposed on each vertex of an imaginary triangle, similarly to the center of the first pixel electrode PE1, the center of the second pixel electrode PE2, and the center of the third pixel electrode PE3.

The first opening OP1 may be adjacent to the second opening OP2 along the third direction D3, and the third opening OP3 may be adjacent to the second opening OP2 along the fourth direction D4.

In some embodiments, a first width OW1 of the second opening OP2 measured along the direction toward the first opening OP1 may be different from a second width OW2 of the second opening OP2 measured along the direction toward the third opening OP3. Illustratively, the first width OW1 of the second opening OP2 may be larger than the second width OW2 of the second opening OP2.

The first shortest gap G1 between the first opening OP1 and the second opening OP2 may be longer than the second shortest gap G2 between the third opening OP3 and the second opening OP2. Thus, as will be described later, when the first organic layer OL1, the second organic layer OL2, and the third organic layer OL3 having different thicknesses from each other are deposited using a fine metal mask, deposition reliability is improved. This contributes to the improvement of display quality of the display device 1 and the improvement of reliability.

Considering the relationship among the first pixel electrode PE1, the second pixel electrode PE2, the third pixel electrode PE3, the first opening OP1, the second opening OP2, and the third opening OP3, in some embodiments, a shortest gap G1b between the second opening OP2 and the first pixel electrode PE1 may be longer than a shortest gap G2b between the second opening OP2 and the third pixel electrode PE3. Further, a shortest gap G1c between the second pixel electrode PE2 and the first opening OP1 may be longer than a shortest gap G2c between the second pixel electrode PE2 and the third opening OP3. This is based on the area magnitude relationship among the first pixel electrode PE1, the second pixel electrode PE2, and the third pixel electrode PE3, the area magnitude relationship among the first opening OP1, the second opening OP2, and the third opening OP3, and the magnitude relationship between the first shortest gap G1 and the second shortest gap G2.

The first organic layer OL1 may be disposed on the first pixel electrode PE1 exposed by the first opening OP1, the second organic layer OL2 may be disposed on the second pixel electrode PE2 exposed by the second opening OP2, and the third organic layer OL3 may be disposed on the third pixel electrode PE3 exposed by the third opening OP3.

In an embodiment, a part of the first organic layer OL1 may be disposed outside the first opening OP1 and may be disposed on the pixel defining film 150. Similarly, a part of the second organic layer OL2 may be disposed outside the second opening OP2 and may be disposed on the pixel defining film 150, and a part of the third organic layer OL3 may be disposed outside the third opening OP3 and may be disposed on the pixel defining film 150.

In an embodiment, the first organic layer OL1 includes a first light emitting layer OL1a and a first resonance control layer OL1b disposed between the first light emitting layer OL1a and the first pixel electrode PE1.

The first light emitting layer OL1a may be an organic light emitting layer that emits light of a first color. In some embodiments, the first color may be red, and the wavelength of light emitted from the first light emitting layer OL1a may be about 620 nm to about 750 nm.

The first resonance control layer OL1b may be disposed between the first light emitting layer OL1a and the first pixel electrode PE1 and may overlap with the first light emitting layer OL1a.

In some embodiments, the first resonance control layer OL1b may include a hole transport material.

In an embodiment, the first light emitting layer OL1a may emit red light as described above. In this case, a first resonance distance of light emitted from the first light emitting layer OL1a may be controlled by a thickness W1b of the first resonance control layer OL1b.

A first resonance distance may be approximately defined as a distance between the first pixel electrode PE1 and the common electrode CE. When the first resonance distance is approximately set to an integral multiple of a value obtained by dividing the wavelength of the red light by two, the red light emitted from the first light emitting layer OL1a may interfere constructively, and, as a result, the intensity of the red light output to the outside may increase.

The first light emitting layer OL1a and first resonance control layer OL1b of the first organic layer OL1 may be formed using a same fine metal mask (FMM) (for example, referred to as a first mask). Thus, in some embodiments, each of the first light emitting layer OL1a and the first resonance control layer OL1b may have an island shape, and the planar shape of the first light emitting layer OL1a may be the same (the same or substantially the same) as the planar shape of the first resonance control layer OL1b. Further, on the plane, an area of the first light emitting layer OL1a may be equal (equal or substantially equal) to an area of the first resonance control layer OL1b.

The sum of a thickness W1a of the first light emitting layer OL1a disposed on the first pixel electrode PE1 and the thickness W1b of the first resonance control layer OL1b disposed on the first pixel electrode PE1, that is, a first thickness W1 of the first organic layer OL1 may be thicker than a second thickness W2 of the second organic layer OL2 to be described later and may be thicker than a third thickness W3 of the third organic layer OL3 to be described later.

In an embodiment, the second organic layer OL2 includes a second light emitting layer OL2a and a second resonance control layer OL2b disposed between the second light emitting layer OL2a and the second pixel electrode PE2.

The second light emitting layer OL2a may be an organic light emitting layer that emits light of a second color different from the first color. In some embodiments, the second color may be green, and the wavelength of light emitted from the second light emitting layer OL2a may be about 495 nm to about 570 nm.

The second resonance control layer OL2b may be disposed between the second light emitting layer OL2a and the second pixel electrode PE2 and may overlap with the second light emitting layer OL2a. In some embodiments, the second resonance control layer OL2b may include a hole transport material.

A second resonance distance between the second pixel electrode PE2 and the common electrode CE can be controlled by a thickness W2b of the second resonance control layer OL2b.

The second light emitting layer OL2a and second resonance control layer OL2b of the second organic layer OL2 may be formed using a same fine metal mask (FMM) (for example, referred to as a second mask). The second mask may be a mask different from the first mask. Thus, in some embodiments, each of the second light emitting layer OL2a and the second resonance control layer OL2b may have an island shape, and the planar shape of the second light emitting layer OL2a may be the same (the same or substantially the same) as the planar shape of the second resonance control layer OL2b. Further, on the plane, an area of the second light emitting layer OL2a may be equal (equal or substantially equal) to an area of the second resonance control layer OL2b.

As will be described later, on the plane, an area SL2 of the second organic layer OL2 may be smaller than an area SL1 of the first organic layer OL1. Thus, the area of the first light emitting layer OL1a may be larger than the area of the second light emitting layer OL2a, and the area of the first resonance control layer OL1b may be larger than the area of the second resonance control layer OL2b.

The sum of a thickness W2a of the second light emitting layer OL2a disposed on the second pixel electrode PE2 and the thickness W2b of the second resonance control layer OL2b disposed on the second pixel electrode PE2, that is, a second thickness W2 of the second organic layer OL2 may be thinner than the first thickness W1 of the first organic layer OL1 and may be thicker than a third thickness W3 of the third organic layer OL3.

In some embodiments, the thickness W2b of the second resonance control layer OL2b may be thicker than the thickness W1a of the first resonance control layer OL1b, but the present invention is not limited thereto.

The third organic layer OL3 may be a third light emitting layer.

The third organic layer OL3 may be an organic light emitting layer that emits light of a third color different from the first color and the second color. In some embodiments, the third color may be blue, and the wavelength of light emitted from the third organic layer OL3 may be about 450 nm to about 495 nm.

In some embodiments, the third organic layer OL3 may not include a separate resonance control layer, unlike the first organic layer OL1 and the second organic layer OL2.

The third organic layer OL3 may be formed using a same fine metal mask (FMM) (for example, referred to as a third mask). The third mask may be a mask different from the first mask and the second mask.

On the third pixel electrode PE3 exposed by the third opening OP3, a third thickness W3 of the third organic layer OL3 may be thinner than the first thickness W1 of the first organic layer OL1 and may be thinner than the second thickness W2 of the second organic layer OL2.

As will be described further later, on the plane, an area SL3 of the third organic layer OL3 may be larger than the area SL1 of the first organic layer OL1 and the area SL2 of the second organic layer OL2. Thus, the area SL3 of the third organic layer OL3 may be larger than the area of the first light emitting layer OL1a, the area of the second light emitting layer OL2a, the area of the first resonance control layer OL1b, and the area of the second resonance control layer OL2b.

In an embodiment, on the pixel defining film 150, edges of the first organic layer OL1 and the second organic layer OL2 may partially overlap with each other, and edges of the third organic layer OL3 and the second organic layer OL2 may partially overlap with each other. A thickness W11 of a portion of the first organic layer OL1 overlapping with the second organic layer OL2 may be thinner than the first thickness W1. Similarly, a thickness W21 of a portion of the second organic layer OL2 overlapping with the first organic layer OL1 and a thickness W22 of a portion of the second organic layer OL2 overlapping with the third organic layer OL3 may be thinner than the second thickness W2. Further, a thickness W31 of a portion of the third organic layer OL3 overlapping with the second organic layer OL2 may be thinner than the third thickness W3.

In some embodiments, the portion of the second organic layer OL2 overlapping with the first organic layer OL1 may be disposed on the first organic layer OL1, and the portion of the second organic layer OL2 overlapping with the third organic layer OL3 may be disposed on the third organic layer OL3.

In some embodiments, the overlapping portion between the second organic layer OL2 and the first organic layer OL1 and the overlapping portion of the second organic layer OL2 and the third organic layer OL3 may be formed by a process margin set in the process of forming the first organic layer OL1, the second organic layer OL2, and the third organic layer OL3. In some embodiments, a width OV1 of the overlapping portion between the second organic layer OL2 and the first organic layer OL1 may be equal (equal or substantially equal) to a width OV2 of the overlapping portion of the second organic layer OL2 and the third organic layer OL3. This may be a result based on a preset process margin.

Herein, a planar structure of the first organic layer OL1, the second organic layer OL2, and the third organic layer OL3 will be described.

Each of the first organic layer OL1, the second organic layer OL2, and the third organic layer OL3 may have an island shape.

In some embodiments, centers of the first organic layer OL1 and the third organic layer OL3 may be disposed on the first imaginary line VL1 extending along the first direction D1, and may be alternately arranged along the first imaginary line VL1. Further, in some embodiments, a center of the second organic layer OL2 may be disposed on the second imaginary line VL2 substantially parallel to the first imaginary line VL1, and the center of the first organic layer OL1 and the center of the third organic layer OL3 may not be disposed on the second imaginary line VL2.

In some embodiments, the center of the first organic layer OL1, the center of the second organic layer OL2, and the center of the third organic layer OL3 may be disposed on each vertex of an imaginary triangle.

The areas of the first organic layer OL1, the second organic layer OL2, and the third organic layer OL3 may be different from each other. Illustratively, the area SL3 of the third organic layer OL3 may be larger than the area SL1 of the first organic layer OL1 and the area SL2 of the second organic layer OL2, and the area SL1 of the first organic layer OL1 may be larger than the area SL2 of the second organic layer OL2.

Considering the relationship among the first organic layer OL1, the second organic layer OL2, the third organic layer OL3, the first opening OP1, the second opening OP2, and the third opening OP3, in some embodiments, a shortest gap G3a between the second opening OP2 and the first organic layer OL1 may be longer than a shortest gap G4a between the second opening OP2 and the third organic layer OL3. Further, a shortest gap G3b between the second organic layer OL2 and the first opening OP1 may be longer than a shortest gap G4b between the second organic layer OL2 and the third opening OP3.

Considering the relationship among the first organic layer OL1, the second organic layer OL2, the third organic layer OL3, the first pixel electrode PE1, the second pixel electrode PE2, and the third pixel electrode PE3, a shortest gap G5a between the second pixel electrode PE2 and the first organic layer OL1 may be longer than a shortest gap G6a between the second pixel electrode PE2 and the third organic layer OL3. Further, a shortest gap G5b between the second organic layer OL2 and the first pixel electrode PE1 may be longer than a shortest gap G6b between the second organic layer OL2 and the third pixel electrode PE3.

These relationships may be results based on the aforementioned area magnitude relationship among the first pixel electrode PE1, the second pixel electrode PE2, and the third pixel electrode PE3, the aforementioned area magnitude relationship among the first opening OP1, the second opening OP2, and the third opening OP3, and the aforementioned magnitude relationship between the first shortest gap G1 and the second shortest gap G2.

The common electrode CE may be disposed on the first organic layer OL1, the second organic layer OL2, and the third organic layer OL3. In some embodiments, the common electrode CE may be disposed over an entire surface of the base substrate 110. In some embodiments, the common electrode CE may be a cathode electrode, which is an electron injection electrode.

Figure 11:
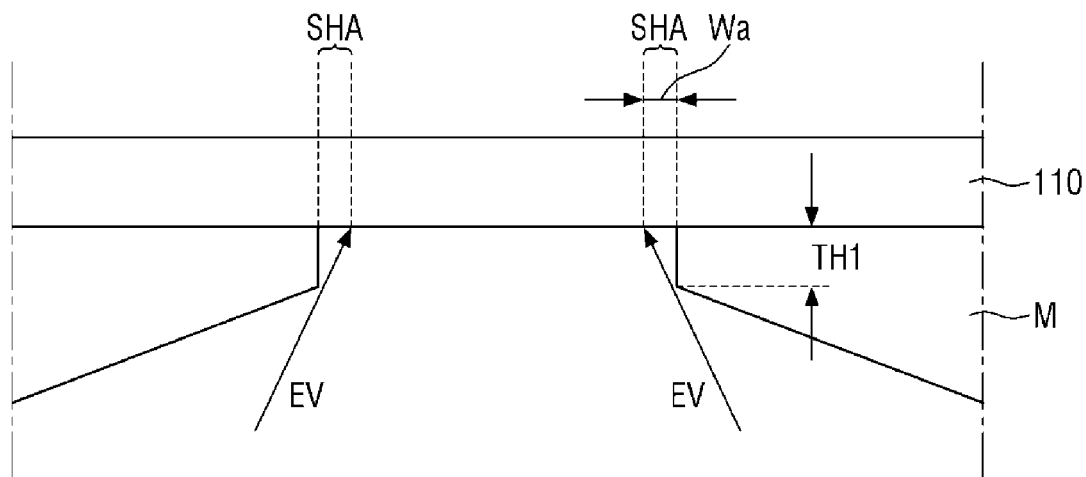
FIGS. 11 and 12 are schematic views for explaining a deposition process of an organic layer.
Figure 12:
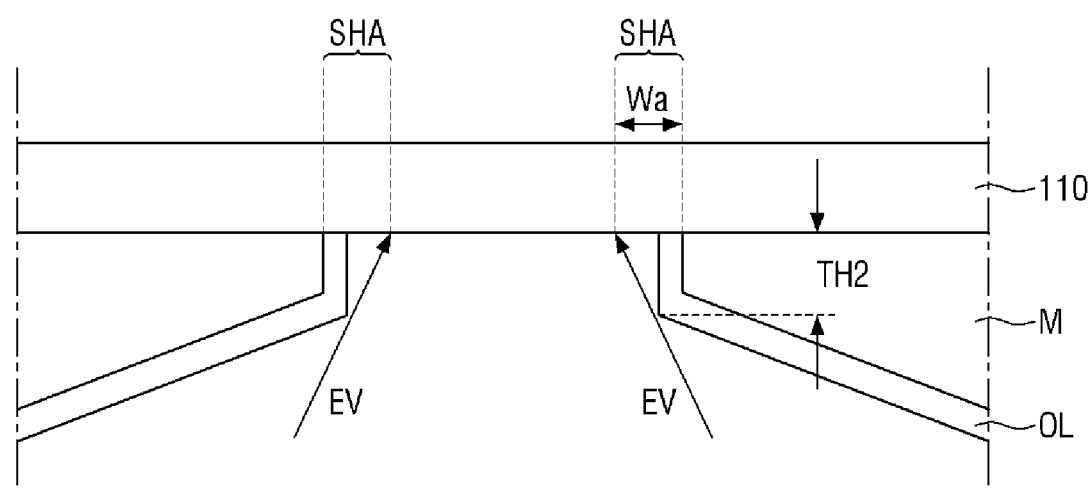

FIGS. 11 and 12 are schematic views for explaining a deposition process of an organic layer. For convenience of explanation, in FIGS. 11 and 12, only the base substrate 110 and a mask M are shown.

Referring to FIGS. 11 and 12 in addition to FIGS. 1 to 10, at the time of forming an organic layer, a process of placing a mask M having a pattern on the base substrate 110 and depositing an organic material EV is performed.

The mask M itself has a thickness (e.g., a predetermined thickness), and, in particular, a step having a thickness (e.g., a predetermined thickness) TH1 is inevitably provided around the pattern of the mask M. Due to the step of the mask M, a region where the organic material EV is not deposited to an intended thickness, that is, a shadow region SHA is formed.

As the deposition process of the organic material EV proceeds, a part of the organic material EV is also deposited on the mask M to form an organic material remaining layer OL. With the deposition process of the organic material EV, the step of the mask M and the organic material remaining layer OL itself may act as a new step. Here, a thickness TH2 of the new step may be thicker than the thickness TH1 of the mask M itself. Thus, a width Wa of the shadow region SHA may increase as the organic material EV is deposited.

As the width Wa of the shadow region SHA increases, the organic layer deposited on the base substrate 110 includes more uneven regions. That is, as the width Wa of the shadow region SHA increases, a portion where the thickness decreases, for example, a tail portion, increases at the edge of the organic layer formed on the base substrate 110. When the portion of the organic layer not deposited to an intended thickness, that is, the tail portion, is located in the opening, an intended level of light emission is not achieved, and, thus, the reliability of the display device may deteriorate.

As described above, the thicknesses of the first organic layer OL1, the second organic layer OL2, and the third organic layer OL3 may be different from each other. In an embodiment, the first thickness W1 of the first organic layer OL1 is thicker than the second thickness W2 of the second organic layer OL2 and the third thickness W3 of the third organic layer OL3.

Accordingly, since the thickness of the organic material remaining layer OL deposited on the mask M also increases at the time of forming the first organic layer OL1, in the case of the first organic layer OL1, there is a possibility that a tail portion (or a portion whose thickness is thinner than an intended level) relative to the second organic layer OL2 and the third organic layer OL3 is formed relatively longer, and thus there is a higher possibility that the tail portion (or the portion whose thickness is thinner than the intended level) is located in the first opening OP1, as compared with the second organic layer OL2 and the third organic layer OL3.

In contrast, since the third organic layer OL3 has a relatively thinner thickness than the first organic layer OL1 and the second organic layer OL2, the possibility that the tail portion (or the portion whose thickness is thinner than an intended level) of the third organic layer OL3 is located in the third opening OP3 is lower than the possibility that the tail portion of the first organic layer OL1 is located in the first opening OP1 and the possibility that the tail portion of the second organic layer OL2 is located in the second opening OP2.

That is, the possibility that the tail portion is located in the opening increases as the thickness of the organic layer increases.

According to the above-described embodiments, the first shortest gap G1 between the first opening OP1 and the second opening OP2 is longer than the second shortest gap G2 between the second opening OP2 and the third opening OP3. Therefore, a larger space may be secured between the first opening OP1 and the second opening OP2, such that it is possible to prevent or substantially prevent the relatively thick tail portion of the first organic layer OL1 from being disposed in the first opening OP1. Since the first pixel electrode PE1, the second pixel electrode PE2, and the third pixel electrode PE3 are arranged to correspond to the first opening OP1, the second opening OP2, and the third opening OP3, respectively, as described above, the shortest gap G1a between the first pixel electrode PE1 and the second pixel electrode PE2 may be longer than the shortest gap G2a between the second pixel electrode PE2 and the third pixel electrode PE3.

Moreover, since a larger space may be provided between the first opening OP1 and the second opening OP2 than between the second opening OP2 and the third opening OP3, as described above, the shortest gap G3a between the second opening OP2 and the first organic layer OL1 may be longer than the shortest gap G4a between the second opening OP2 and the third organic layer OL3.

As described above, according to embodiments of the present invention, a display device having improved reliability is provided.

However, the effects of the present invention are not limited by the foregoing, and other various effects are anticipated herein.

Although some exemplary embodiments of the present invention have been described for illustrative purposes, those skilled in the art will appreciate that various modifications, additions, and substitutions are possible, without departing from the scope and spirit of the invention as disclosed in the accompanying claims.

What is claimed is:

1. A display device, comprising:
   a base substrate;
   a first pixel electrode, a second pixel electrode, and a third pixel electrode arranged on the base substrate to be spaced apart from each other;
   a pixel defining layer on the first pixel electrode, the second pixel electrode, and the third pixel electrode and comprising a first opening overlapping the first pixel electrode, a second opening overlapping the second pixel electrode and spaced apart from the first opening, and a third opening overlapping the third pixel electrode and spaced apart from the first opening and the second opening;
   a first layer on the first pixel electrode overlapped by the first opening and comprising a first light emitting layer;
   a second layer on the second pixel electrode overlapped by the second opening and comprising a second light emitting layer; and
   a third layer on the third pixel electrode overlapped by the third opening and comprising a third light emitting layer,
   wherein a shortest gap between the third opening and the second opening is different from a shortest gap between the first opening and the second opening in a plan view.

2. The display device of claim 1, wherein:
the first opening and the second opening are spaced apart from each other along a first direction, and
the second opening and the third opening are spaced apart from each other along a second direction crossing the first direction.

3. The display device of claim 2, wherein:
a width of the first opening in the first direction is different from a width of the second opening in the first direction, and
a width of the second opening in the second direction is different from a width of the third opening in the second direction.

4. The display device of claim 2, wherein a width of the second opening in the first direction is different from a width of the second opening in the second direction.

5. The display device of claim 1, wherein
an area of the third opening is different from an area of the first opening and an area of the second opening, and
the area of the first opening is different from the area of the second opening.

6. The display device of claim 1, wherein, in a plan view, a shortest gap between the third layer and the second opening is different from a shortest gap between the first layer and the second opening.

7. The display device of claim 1, wherein, in a plan view, a shortest gap between the third pixel electrode and the second opening is different from a shortest gap between the first pixel electrode and the second opening.

8. The display device of claim 1, wherein, in a plan view, a shortest gap between the third pixel electrode and the second pixel electrode is different from a shortest gap between the first pixel electrode and the second pixel electrode.

9. The display device of claim 1, wherein
a first thickness of a portion of the first layer overlapping the first pixel electrode is different from a second thickness of a portion of the second layer overlapping the second pixel electrode, and
the second thickness of the portion of the second layer overlapping the second pixel electrode is different from a third thickness of a portion of the third layer overlapping the third pixel electrode.

10. The display device of claim 1, wherein each of the first layer, the second layer, and the third layer has an island shape.

11. The display device of claim 1, wherein the first light emitting layer is a red light emitting layer, the second light emitting layer is a green light emitting layer, and the third light emitting layer is a blue light emitting layer.

12. The display device of claim 11, wherein
the first layer comprises a first resonance control layer between the first light emitting layer and the first pixel electrode,
the second layer comprises a second resonance control layer between the second light emitting layer and the second pixel electrode,
a shape of the first light emitting layer is the same as a shape of the first resonance control layer, and
a shape of the second light emitting layer is the same as a shape of the second resonance control layer.

13. The display device of claim 1, wherein the second layer comprises a portion overlapping the first layer and a portion overlapping the third layer.

14. The display device of claim 13, wherein the portion of the second layer overlapping the first layer is on the first layer, and the portion of the second layer overlapping the third layer is on the third layer.

15. The display device of claim 13, wherein each of the portion of the second layer overlapping the first layer and the portion of the second layer overlapping the third layer comprises a portion that is thinner than a second thickness of a portion of the second layer overlapping the second pixel electrode.

16. A display device, comprising:
a base substrate;
a first pixel electrode, a second pixel electrode, and a third pixel electrode arranged on the base substrate to be spaced apart from each other;
a pixel defining layer on the first pixel electrode, the second pixel electrode, and the third pixel electrode and comprising a first opening overlapping the first pixel electrode, a second opening overlapping the second pixel electrode and spaced apart from the first opening, and a third opening overlapping the third pixel electrode and spaced apart from the first opening and the second opening;
a first layer on the first pixel electrode overlapped by the first opening and comprising a first light emitting layer;
a second layer on the second pixel electrode overlapped by the second opening and comprising a second light emitting layer; and
a third layer on the third pixel electrode overlapped by the third opening and comprising a third light emitting layer,
wherein each of the first layer, the second layer, and the third layer has an island shape,
wherein, in a plan view, a shortest gap between the third layer and the second opening is different from a shortest gap between the first layer and the second opening, and
wherein the first opening and the second opening are spaced apart from each other along a first direction, and the second opening and the third opening are spaced apart from each other along a second direction crossing the first direction.

17. The display device of claim 16,
wherein a first thickness of a portion of the first layer overlapping the first pixel electrode is different from a second thickness of a portion of the second layer overlapping the second pixel electrode, and
wherein the second thickness of the portion of the second layer overlapping the second pixel electrode is different from a third thickness of a portion of the third layer overlapping the third pixel electrode.

18. The display device of claim 16, wherein, in a plan view, a shortest gap between the third opening and the second layer is different from a shortest gap between the first opening and the second layer.

19. The display device of claim 16, wherein, in a plan view, a shortest gap between the third layer and the second pixel electrode is different from a shortest gap between the first layer and the second pixel electrode.

20. The display device of claim 16, wherein
an area of the third layer is different from an area of the first layer and an area of the second layer,
the area of the first layer is different from the area of the second layer,
an area of the third opening is different from an area of the first opening and an area of the second opening, and
the area of the first opening is different from the area of the second opening.

21. A display device, comprising:
a base substrate;
a first pixel electrode, a second pixel electrode, and a third pixel electrode arranged on the base substrate to be spaced apart from each other;
a first layer on the first pixel electrode and comprising a first light emitting layer;
a second layer on the second pixel electrode and comprising a second light emitting layer;
a third layer on the third pixel electrode and comprising a third light emitting layer; and
a common electrode on the first layer, the second layer, and the third layer,
wherein each of the first layer, the second layer, and the third layer has an island shape, and
wherein, in a plan view, a shortest gap between the third pixel electrode and the second pixel electrode is different form a shortest gap between the first pixel electrode and the second pixel electrode.

22. The display device of claim 21,
wherein a first thickness of a portion of the first layer overlapping the first pixel electrode is different from a second thickness of a portion of the second layer overlapping the second pixel electrode, and
wherein the second thickness of the portion of the second layer overlapping the second pixel electrode is different from a third thickness of a portion of the third layer overlapping the third pixel electrode.

23. The display device of claim 21, wherein, in a plan view, a shortest gap between the third layer and the second pixel electrode is different from a shortest gap between the first layer and the second pixel electrode.

24. The display device of claim 21, wherein
an area of the third pixel electrode is different from an area of the first pixel electrode and an area of the second pixel electrode, and
the area of the first pixel electrode is different from the area of the second pixel electrode.

* * * * *